(12) United States Patent
Takanaka et al.

(10) Patent No.: US 12,376,217 B2
(45) Date of Patent: Jul. 29, 2025

(54) X-RAY DIAGNOSTIC APPARATUS

(71) Applicant: CANON MEDICAL SYSTEMS CORPORATION, Otawara (JP)

(72) Inventors: Makoto Takanaka, Nasushiobara (JP); Manabu Fukuwara, Otawara (JP); Masahiko Ono, Nasushiobara (JP)

(73) Assignee: CANON MEDICAL SYSTEMS CORPORATION, Otawara (JP)

( * ) Notice: Subject to any disclaimer, the term of this patent is extended or adjusted under 35 U.S.C. 154(b) by 44 days.

(21) Appl. No.: 18/458,300

(22) Filed: Aug. 30, 2023

(65) Prior Publication Data
US 2024/0080963 A1   Mar. 7, 2024

(30) Foreign Application Priority Data

Sep. 7, 2022 (JP) ................. 2022-142564

(51) Int. Cl.
  *H05G 1/54*  (2006.01)
  *G01R 19/00* (2006.01)
  *H05G 1/26*  (2006.01)
(52) U.S. Cl.
  CPC ........... *H05G 1/54* (2013.01); *G01R 19/0092* (2013.01); *H05G 1/265* (2013.01)
(58) Field of Classification Search
  CPC .............. G01R 19/0092; G01R 31/304; G01R 31/257; H05G 1/265; H05G 1/54; H05G 1/085; H05G 1/46; H05G 1/32; H05G 1/30; H05G 1/34; H05G 1/52; H05G 1/60; H05G 1/20; H05G 1/58; H01J 35/066; H01J 35/08; H01J 35/045; H01J 35/20; H01J 35/18; H01J 35/025; H01J 35/16; H01J 2235/18; H01J 2235/20; H01J 35/06; H01J 2235/08; H01J 35/26; H01J 2235/068; A61B 6/54; A61B 6/405; A61B 6/032; A61B 6/482; A61B 6/4021
(Continued)

(56) References Cited

U.S. PATENT DOCUMENTS

2003/0021380 A1* 1/2003 Brendler ............... H01J 35/045
  378/154
2004/0114722 A1* 6/2004 Shimono .................. H05G 1/34
  378/138

(Continued)

FOREIGN PATENT DOCUMENTS

JP   2018-32561 A   3/2018

*Primary Examiner* — Irakli Kiknadze
(74) *Attorney, Agent, or Firm* — Oblon, McClelland, Maier & Neustadt, L.L.P.

(57) ABSTRACT

In one embodiment, an X-ray diagnostic apparatus includes: an X-ray generator; a current measurement circuit; a display; and processing circuitry. The X-ray generator includes: a filament connected to a cathode of an X-ray tube and configured to emit electrons; a target connected to an anode of the X-ray tube and configured to generate X-rays by receiving the electrons; and a grid configured to adjust an electric potential gradient around the filament. The current measurement circuit measures an electric current flowing between an electrode of the grid and a common electrode of the filament. The processing circuitry calculates an index related to a lifetime of the filament on the basis of a measurement value of the electric current, and causes the display to display the index.

8 Claims, 8 Drawing Sheets

(58) Field of Classification Search
USPC .................................. 378/98, 119, 134–138
See application file for complete search history.

(56) References Cited

U.S. PATENT DOCUMENTS

| | | | |
|---|---|---|---|
| 2006/0008053 A1* | 1/2006 | Ishikawa | H05G 1/30 |
| | | | 378/111 |
| 2006/0280289 A1* | 12/2006 | Hanington | H05G 1/10 |
| | | | 378/104 |
| 2014/0146943 A1* | 5/2014 | Aoki | H05G 1/54 |
| | | | 378/138 |
| 2014/0161221 A1* | 6/2014 | Miyazaki | H05G 1/085 |
| | | | 378/16 |
| 2017/0118830 A1* | 4/2017 | Totsuka | H01J 35/08 |
| 2018/0063934 A1 | 3/2018 | Obata et al. | |
| 2019/0317144 A1* | 10/2019 | Xu | H01J 35/025 |
| 2020/0068692 A1* | 2/2020 | Ernest | H05G 1/06 |
| 2020/0245442 A1* | 7/2020 | Hirayama | H05G 1/10 |

* cited by examiner

| MEASUREMENT TIME | GRID CURRENT Ig(mA) | TOTAL HEATING TIME OF FILAMENT / LIFETIME (H) | CONSUMPTION RATE (%) OF FILAMENT |
|---|---|---|---|
| AT THE TIME OF INSTALLATION | 45 | 0 | 0 |
| AFTER N YEARS OF USE | 55 | 125 | 25 =(55−45)/(85−45)×100 |
| AT THE END OF LIFETIME | 85 | 500 =125×(85−45)/(55−45) | 100 |

X-RAY DIAGNOSTIC APPARATUS

CROSS-REFERENCE TO RELATED APPLICATION

This application is based upon and claims the benefit of priority from Japanese Patent Application No. 2022-142564, filed on Sep. 7, 2022, the entire contents of which are incorporated herein by reference.

TECHNICAL FIELD

Disclosed embodiments relate to an X-ray diagnostic apparatus.

BACKGROUND

In the medical field, an X-ray diagnostic apparatus configured to radiate X-rays generated by its X-ray tube is used to obtain fluoroscopic images of an object. In the X-ray tube, an electric potential difference of several volts is applied between both ends of a filament connected to a cathode, and an electric potential difference of several kV to several hundred kV is applied between the cathode and the anode. Next, electrons are emitted from the filament that is heated up to about 2000° C. due to the electric potential difference between both ends of the filament. Further, due to the electric potential difference between the cathode and the anode, the electrons emitted from the filament of the cathode collide at high speed with a target on the surface of the anode, and consequently, X-rays are generated from the target.

The filament used in the X-ray tube becomes thinner and thinner due to deterioration, and eventually breaks. Techniques for predicting filament breakage have been developed. For example, JP 2018-032561 A (hereinafter referred to as Patent Document 1) discloses an X-ray apparatus that can detect an indication of filament breakage. The X-ray apparatus of Patent Document 1 monitors an electric current value of at least one of the filament current and the tube current, detects fluctuation of the current value, determines whether there is an indication of filament breakage based on the fluctuation of the current value, and issues a warning on the basis of this determination.

The X-ray apparatus of Patent Document 1 can detect an indication of breakage of the filament of the X-ray tube but cannot indicate how much longer the filament can be used. In other words, there is a problem that the X-ray apparatus of Patent Document 1 cannot estimate the lifetime of the filament of the X-ray tube.

DETAILED DESCRIPTION

Hereinbelow, embodiments of an X-ray diagnostic apparatus will be described in detail by referring to the accompanying drawings.

In one embodiment, an X-ray diagnostic apparatus includes: an X-ray generator; a current measurement circuit; a display; and processing circuitry. The X-ray generator includes: a filament connected to a cathode of an X-ray tube and configured to emit electrons; a target connected to an anode of the X-ray tube and configured to generate X-rays by receiving the electrons; and a grid configured to adjust an electric potential gradient around the filament. The current measurement circuit measures an electric current flowing between an electrode of the grid and a common electrode of the filament. The processing circuitry calculates an index related to a lifetime of the filament on the basis of a measurement value of the electric current, and causes the display to display the index.

Figure 1:
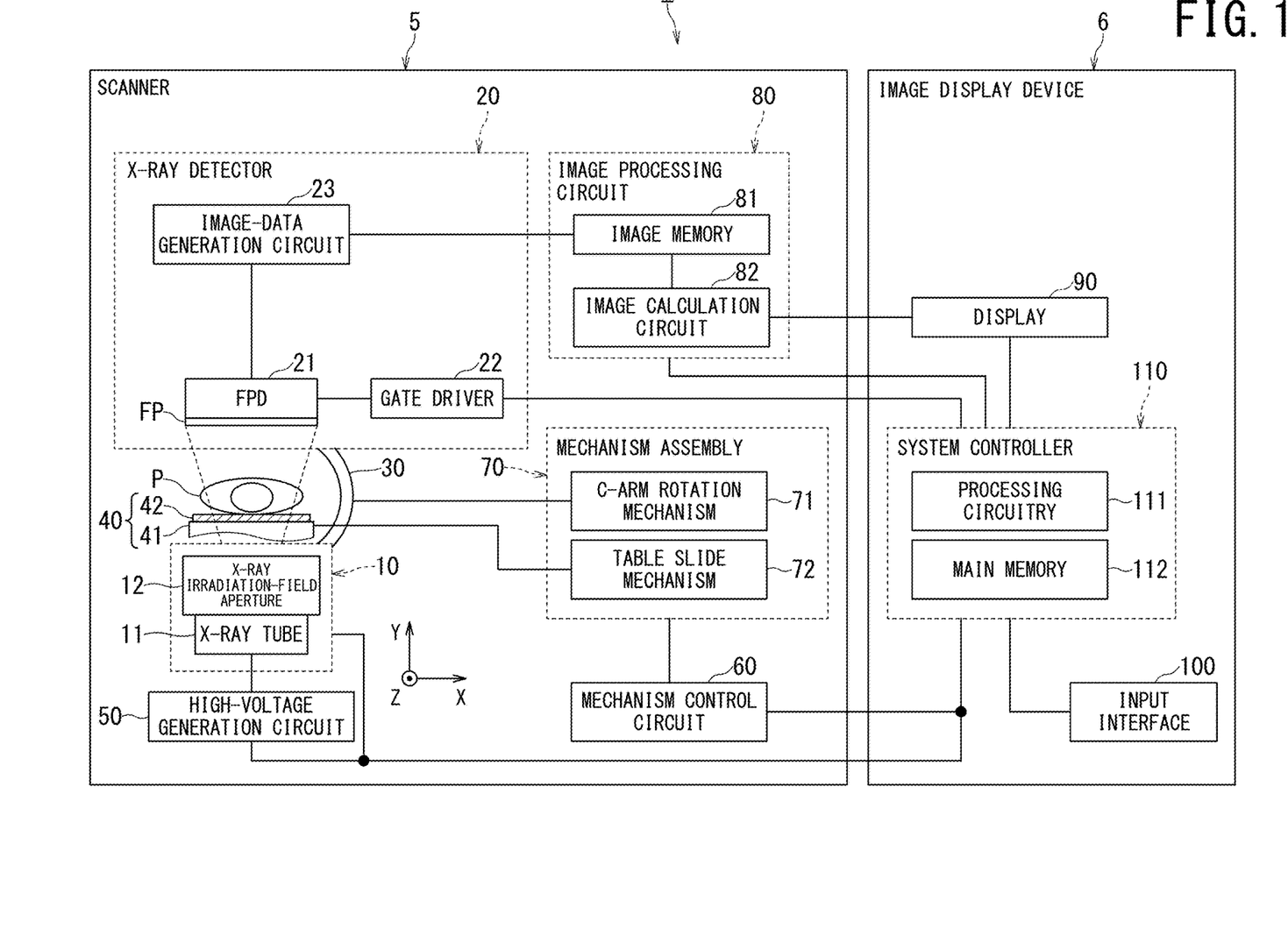
FIG. 1 is a schematic diagram illustrating a configuration of an X-ray diagnostic apparatus according to one embodiment.
Figure 2:
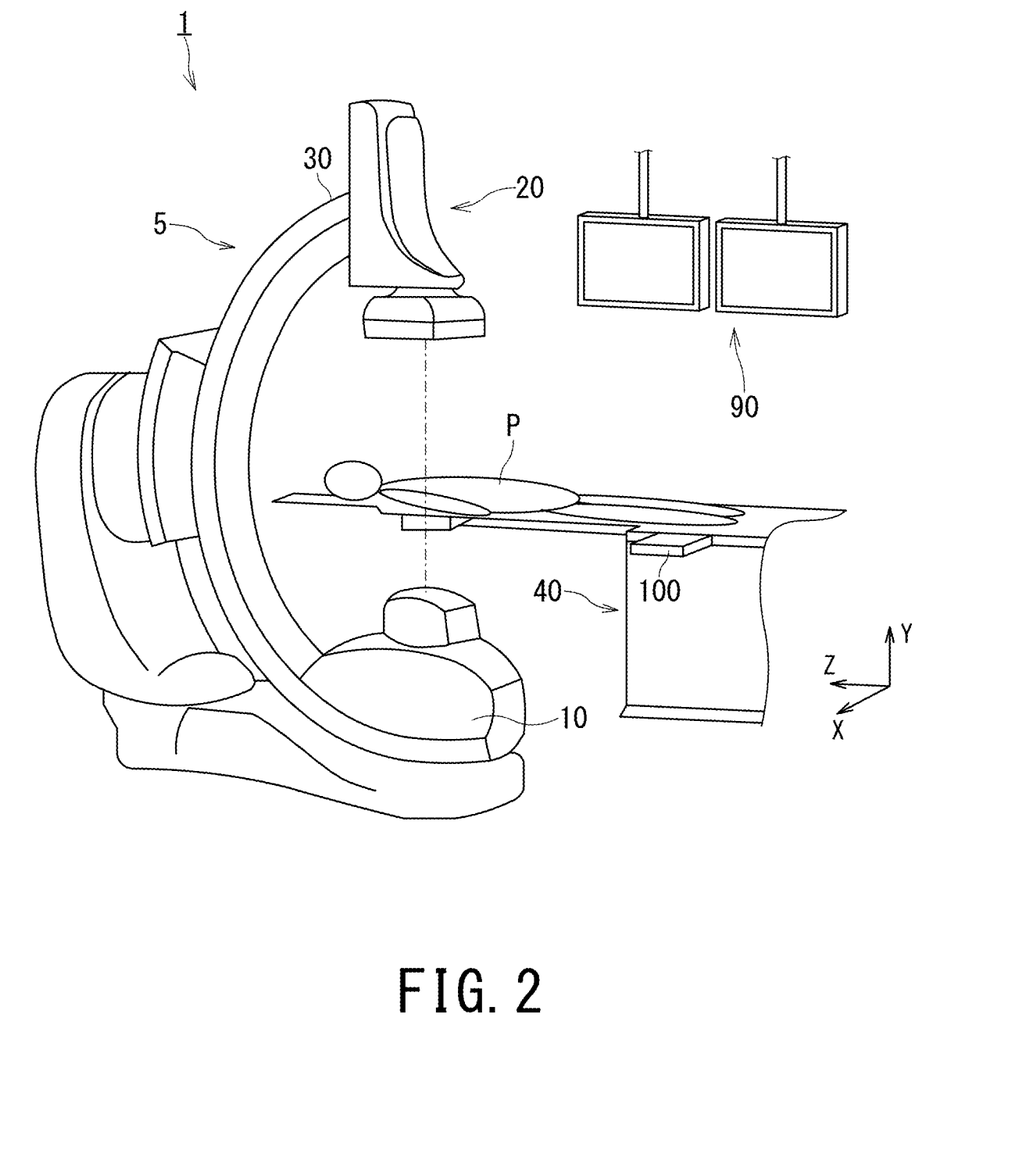
FIG. 2 is a perspective view illustrating the appearance of part of the X-ray diagnostic apparatus according to the embodiment.

FIG. 1 is a schematic diagram illustrating a configuration of an X-ray diagnostic apparatus 1 according to one embodiment. FIG. 2 is a perspective view illustrating the appearance of part of the X-ray diagnostic apparatus 1 according to the embodiment.

The X-ray diagnostic apparatus according to the present embodiment is an apparatus that includes an X-ray tube and a control circuit configured to control output of the X-ray tube, and can image an object such as a patient. For example, aspects of the X-ray diagnostic apparatus according to the present embodiment include a simple X-ray imaging apparatus (e.g., an X-ray radiographic imaging apparatus), an X-ray imaging apparatus for circulatory organs (e.g., an X-ray angiography apparatus), an X-ray imaging apparatus for digestive organs (e.g., X-ray TV apparatus), and an X-ray mammography apparatus. Although a description will be given of the case where the X-ray diagnostic apparatus according to the present embodiment is the X-ray imaging apparatus for circulatory organs, the present embodiment is not limited to such a case.

As shown in FIG. 1 and FIG. 2, the X-ray diagnostic apparatus 1 according to the embodiment can support imaging mainly for an IVR (Interventional Radiology) procedure using X-ray fluoroscopy. The IVR procedure is primarily catheter-based treatment performed during imaging. In the IVR procedure, the X-ray diagnostic apparatus 1 can generate and display X-ray radiographic images as X-ray images during X-ray imaging, and can also time-sequentially generate X-ray fluoroscopic images of a plurality of frames as X-ray images on a real-time basis during X-ray fluoroscopic imaging and time-sequentially display the generated X-ray fluoroscopic images in real time.

The X-ray diagnostic apparatus 1 includes a scanner 5 and an image display device 6. The scanner 5 includes an X-ray generator 10 (i.e., X-ray irradiator 10), an X-ray detector 20; a C-arm 30, a bed apparatus 40; a high-voltage generation circuit 50, a mechanism control circuit 60, a mechanism assembly 70, and an image processing circuit 80. The image display device 6 includes a display 90, an input interface 100, and a system controller 110.

The scanner 5 acquires a plurality of X-ray images of an object (such as a patient P) by imaging the patient P under the control of the system controller 110. For example, the scanner 5 performs only the X-ray fluoroscopic imaging on the patient P and acquires a plurality of frames of X-ray fluoroscopic images. Or the scanner 5 acquires X-ray fluoroscopic images of a plurality of frames and one or more X-ray radiographic images by performing both the X-ray fluoroscopic imaging and the X-ray radiographic imaging on the patient P. The X-ray radiographic imaging is meant for generating an X-ray image to be used for diagnosis. The X-ray fluoroscopic imaging, in which X-ray dose is less than the X-ray radiographic imaging, is meant for time-sequentially generating a plurality of frames of X-ray images to show the course of IVR procedure in real time. Additionally, the X-ray fluoroscopic imaging is roughly classified into continuous fluoroscopy and pulse fluoroscopy. Unlike the continuous fluoroscopy, the pulse fluoroscopy is a fluoroscopy method in which X-rays are intermittently radiated with intermittent rectangular waves. The pulse fluoroscopy is slightly inferior to the continuous fluoroscopy in terms of continuity of fluoroscopic images (i.e., frame rate), but it can reduce radiation dose to the patient compared to the continuous fluoroscopy.

The X-ray generator 10 of the scanner 5 includes an X-ray tube 11 and an X-ray irradiation-field aperture 12. The X-ray tube 11 irradiates the patient P with X-rays under the control of the system controller 110. The X-ray tube 11 is a vacuum tube that generates X-rays by accelerating thermal electrons emitted from a filament of the cathode by a high voltage applied between the anode and the cathode, and causing the accelerated thermal electrons to collide with the tungsten anode.

The X-ray irradiation-field aperture 12 slides the aperture under the control of the system controller 110, and forms the X-rays emitted from the X-ray tube 11 into an X-ray cone (i.e., cone beam). The X-ray irradiation-field aperture 12 is disposed between the X-ray tube 11 and the patient P, and narrows down the X-ray beam emitted from X-ray tube 11 so that the region of interest of the patient P is selectively irradiated with the X-ray beam.

The X-ray detector 20 two-dimensionally detects X-rays transmitted through the patient P under the control of the system controller 110. The X-ray detector 20 includes a flat panel detector (FPD) 21, a gate driver 22, and an image-data generation circuit 23.

The X-ray detector 20 can be configured as either a direct conversion system that converts X-rays directly into charges or an indirect conversion system that converts X-rays into light, and then converts into charges. Although the former will be described as one aspect of the embodiment, the latter may also be adopted.

The FPD 21 is one aspect of an X-ray detector configured by two-dimensionally arranging minute elements in the column direction and line direction. Each element of the FPD 21 includes an X-ray detection element, a photoelectric film, a charge storage capacitor, and a TFT (Thin Film Transistor). The X-ray detection element detects X-rays. The photoelectric film generates electric charge corresponding to the amount of incident X-rays. The charge storage capacitor stores the electric charge generated in the photoelectric film. The TFT reads out the electric charge accumulated in the charge storage capacitor as raw data of an X-ray transmission image (i.e., X-ray fluoroscopic image or X-ray radiographic image) at a predetermined timing. The raw data of the X-ray transmission image may be converted by using a NDD (Non Dosimeter Dosimetry) method so as to generate surface dose data of the X-ray transmission image.

The gate driver 22 is installed to extract the electric charge from the FPD 21. The image-data generation circuit 23 generates image data of the X-ray transmission image on the basis of the raw data (or surface dose data) of the X-ray transmission image outputted from the X-ray detector 20.

The image-data generation circuit 23 includes a charge/voltage conversion circuit (not shown), an A/D (Analog to Digital) conversion circuit (not shown), and a parallel/serial conversion circuit (not shown). The charge/voltage conversion circuit converts the electric charge having been read out from the FPD 21 into a voltage. The A/D conversion circuit converts the output of the charge/voltage conversion circuit into a digital signal. The parallel/serial conversion circuit converts the digitally converted image data, which are read out in parallel from the FPD 21 line by line, into a serial signal.

In the X-ray diagnostic apparatus 1, an optical pickup FPD (for example, a fluorescent-lighting and fiber type detector) may be incorporated into the front face of the FPD 21 in order to perform X-ray automatic exposure control. In the case of an examination using X-rays for the X-ray fluoroscopic imaging, X-rays for the X-ray fluoroscopic imaging are detected by the FPD 21, and a feedback loop is established based on detected signal so that the brightness of the display 90 is kept constant. Additionally or alternatively, the feedback loop may be established so that the average value of pixel signals (or video signals) acquired by the FPD 21 becomes constant.

In FIG. 1 and FIG. 2, the imaging system of the C-arm structure provided in the X-ray diagnostic apparatus 1 is illustrated as an under-table system in which the X-ray generator 10 is disposed below the table 42. However, the X-ray diagnostic apparatus 1 is not limited to such an aspect but may be configured as an over-table system in which the X-ray generator 10 is disposed above the table 42.

The C-arm 30 integrally supports the X-ray generator 10 and the X-ray detector 20. The arm for integrally supporting the X-ray generator 10 and the X-ray detector 20 is not limited to a so-called C-arm having a C-shape. For example, the arm for integrally supporting the X-ray generator 10 and the X-ray detector 20 may be a so-called Ω arm having an Ω-shape.

The bed apparatus 40 includes a bed main body 41 and a table 42. The bed main body 41 includes respective drive units that support and drive the table 42. The patient P is placed on the table 42. The X-axis, Y-axis, and Z-axis orthogonal to each other are defined as follows: the vertical direction (i.e., direction along the gravity) is the Y-axis direction; the longitudinal direction of the table 42 is the Z-axis direction; and the lateral direction of the table 42 is the X-axis direction.

The high-voltage generation circuit 50 supplies high-voltage power to the X-ray tube 11 of the X-ray generator 10 under the control of the system controller 110. The configuration of the high-voltage generation circuit 50 will be described below in detail by using FIG. 3.

The mechanism control circuit 60 is a power circuit that supplies electricity to the mechanism assembly 70 to rotate the C-arm 30 and slide the table 42 under the control of the system controller 110.

The mechanism assembly 70 includes a C-arm rotation mechanism 71 and a table slide mechanism 72. The C-arm rotation mechanism 71 operates the respective drive units, which constitute the C-arm rotation mechanism 71, under the control of the system controller 110 via the mechanism control circuit 60. In this manner, the C-arm rotation mechanism 71 causes the C-arm 30 supporting the X-ray generator 10 and the X-ray detector 20 to rotate in the arc direction of the C-arm 30 and/or rotate the C-arm 30 around the fulcrum thereof.

The rotation of the C-arm 30 in the arc direction corresponds to the rotation in the direction of CRA (Cranial View) and the rotation in the direction of CAU (Caudal View). The rotation around the fulcrum of the C-arm 30 corresponds to the rotation in the direction of LAO (Left Anterior Oblique View) and the rotation in the direction of RAO (Right Anterior Oblique View). The C-arm 30 may be configured so that the rotation of the C-arm 30 in the arc direction corresponds to the rotation in the respective directions of LAO and RAO, and the rotation around the fulcrum of the C-arm 30 corresponds to the rotation in the respective directions of CRA and CAU.

The table slide mechanism 72 operates the respective power units constituting the bed main body 41 that holds the table 42, under the control of the system controller 110 via the mechanism control circuit 60. As a result, the table slide mechanism 72 can slide the bed main body 41 in each of the lateral direction (i.e., X-axis direction), the vertical direction (i.e., Y-axis direction), and the body-axis direction of the patient P (i.e., Z-axis direction).

The image processing circuit 80 includes an image memory 81 and an image calculation circuit 82. The image memory 81 stores image data to be sequentially outputted in units of lines or frames from the image-data generation circuit 23 under the control of the system controller 110.

The image calculation circuit 82 performs image processing on the image data stored in the image memory 81 under the control of the system controller 110, and stores the processed image data in the image memory 81. The image processing may include enlargement/gradation/spatial-filter processing of image data of X-ray transmission images, minimum/maximum value trace processing of time-sequentially accumulated image data, subtraction processing, and addition processing for removing noise, for example.

Under the control of the system controller 110, the display 90 of the image display device 6 superimposes text/graphic information, such as X-ray irradiation conditions provided by the system controller 110, on the image data of the X-ray transmission image processed by the image processing circuit 80, and then displays the superimposed image. For example, the display 90 is a liquid crystal display, a plasma display panel, an organic EL (Electro Luminescence) panel, a CRT (Cathode Ray Tube) display, or an OLED (Organic Light Emitting Diode) display.

The input interface 100 includes: at least one input medical device that can be operated by a user such as a medical imaging technologist; and an input circuit to which signals from the input medical device are inputted. The input medical device is configured with: a mouse; a keyboard; a track ball; a switch; a button; a joy stick; a touch pad where input manipulation is made by touching its manipulation screen; a touch screen in which the display screen and the touch pad are integrated; a non-contact input circuit using an optical sensor; and/or a voice input circuit, for example. When the input medical device receives an input operation from a user such as a surgery performer, the input circuit generates an electric signal based on the input operation and outputs the electric signal to the processing circuitry 111.

In response to the user's operation on the input interface 100, the input interface 100 transmits signals, which correspond to patient information of the patient P and/or optimal X-ray irradiation conditions for the observation target region of the patient P, to the system controller 110. The patient information includes an examination site, an examination method, physique (body thickness), and past diagnosis history, for example.

The system controller 110 includes processing circuitry 111 and a main memory 112. The system controller 110 controls the entirety of the X-ray diagnostic apparatus 1 in accordance with the user's instructions to be inputted from the input interface 100.

The processing circuitry 111 may be configured as hardware such as a programmable logic device and an ASIC (Application Specific Integrated Circuit) or may be configured as a processor that executes predetermined programs (i.e., software). For example, the processing circuitry 111 is configured as a special-purpose or general purpose CPU (Central Processing Unit) or MPU (Micro Processor Unit). The programmable logic device includes an SPLD (Simple Programmable Logic Device), a CPLD (Complex Programmable Logic Device), and an FPGA (Field Programmable Gate Array), for example. The processing circuitry 111 implements various functions described below by reading out and executing the programs that are stored in the main memory 112 or directly incorporated into the processing circuitry 111.

The processing circuitry 111 may be configured with a single processor or may be configured by combining a plurality of independent processors. In the latter case, a plurality of main memories 112 may individually store the programs corresponding to the functions of the plurality of independent processors or a single main memory 112 may collectively store the programs corresponding to the functions of all the processors.

The main memory 112 is composed of a semiconductor memory element such as a RAM (Random Access Memory) and a flash memory, a hard disk, and/or an optical disk, for example. The main memory 112 may include a portable medium such as a USB (Universal Serial bus) memory and a DVD (Digital Video Disk). The main memory 112 stores various processing programs (including, for example, application programs and an operating system) to be executed by the processing circuitry 111 and data necessary for executing the programs. The operating system may also include a GUI (Graphic User Interface) that frequently uses graphics when displaying information to the user on the display 90 and allows basic operations to be performed by the input interface 100.

Figure 3:
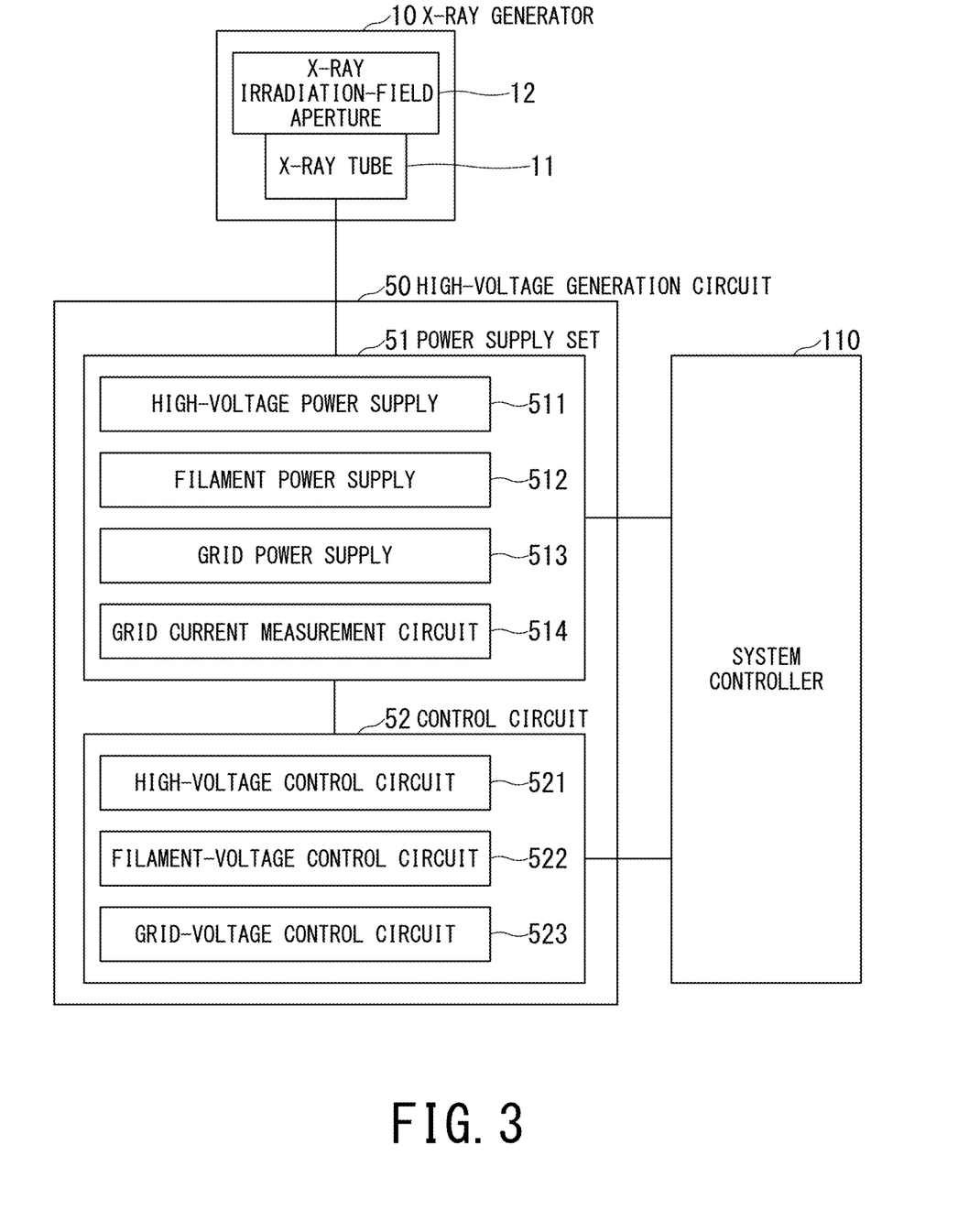
FIG. 3 is a block diagram illustrating an X-ray generator, a high-voltage generation circuit, and a system controller according to the embodiment.

FIG. 3 is a block diagram illustrating the X-ray generator 10, the high-voltage generation circuit 50, and the system controller 110. The high-voltage generation circuit 50 includes a power-supply set 51 and a control circuit 52.

The power-supply set 51 applies voltages to the respective components of the X-ray generator 10 and measures electric currents in some components of the X-ray generator 10. The power-supply set 51 includes a high-voltage power supply 511, a filament power supply 512, a grid power supply 513, and a grid current measurement circuit 514. The high-voltage power supply 511 applies a high voltage between the anode and the cathode of the X-ray tube 11. The filament power supply 512 applies a voltage between the individual electrode of each filament (L, M, S in FIG. 4 described below) and the common electrode that is common to the respective filaments (L, M, S). The grid power supply 513 applies a positive voltage between the grid electrode and the common electrode of the filaments. Note that the grid power supply 513 is one example of a power supply. The grid current measurement circuit 514 is composed of an integrated circuit such as an ASIC (Application Specific Integrated Circuit), an FPGA (Field Programmable Gate Array), and a CPLD (Complex Programmable Logic Device). The grid current measurement circuit 514 measures the electric current flowing between the grid electrode and the common electrode of the filaments. Note that the grid current measurement circuit 514 is one example of a current measurement circuit.

The control circuit 52 controls the respective components of the power-supply set 51. The control circuit 52 includes a high-voltage control circuit 521, a filament-voltage control circuit 522, and a grid-voltage control circuit 523. The high-voltage control circuit 521, the filament-voltage control circuit 522, and the grid-voltage control circuit 523 are composed of an integrated circuit such as an ASIC, an FPGA, and a CPLD. The high-voltage control circuit 521 controls the high-voltage power supply 511 of the power-supply set 51 so as to adjust the voltage to be applied between the anode and the cathode of the X-ray tube 11. The filament-voltage control circuit 522 controls the filament power supply 512 of the power-supply set 51 so as to adjust the voltage to be applied between the individual electrode of each filament and the common electrode that is common to the respective filaments. The grid-voltage control circuit 523 controls the grid power supply 513 of the power-supply set 51 so as to adjust the voltage to be applied between the grid electrode and the common electrode of the filaments.

Figure 4:
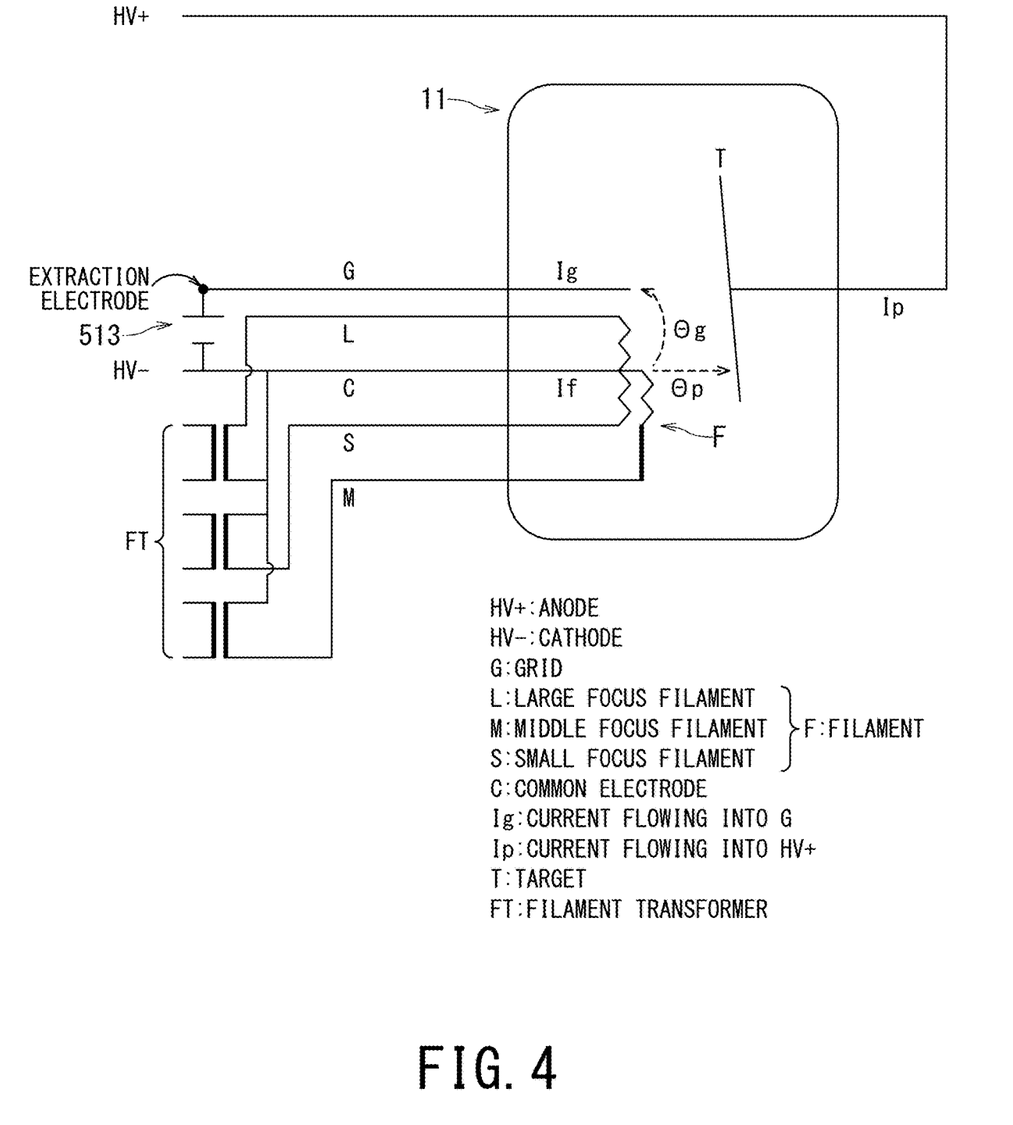
FIG. 4 is a circuit diagram illustrating a configuration of the X-ray tube and its periphery of the X-ray diagnostic apparatus according to the embodiment.

FIG. 4 is a circuit diagram illustrating a configuration of the X-ray tube 11 and its periphery of the X-ray diagnostic apparatus 1 according to the embodiment. As shown in FIG. 4, the X-ray tube 11 includes an anode HV+, a cathode HV−, a filament F, a target T, and a grid G.

The filament F is connected to the cathode HV− of the X-ray tube 11. When a voltage is applied between both terminals and the filament F is heated up to about 2000° C., the filament F emits electrons. In the configuration shown in FIG. 4, the filament F (i.e., filament unit F) is composed of a large focus filament L, a middle focus filament M, and a small focus filament S. The large focus filament L, the middle focus filament M, and the small focus filament S share the common electrode C. A predetermined voltage is applied between the individual electrode of each filament L, M, S and the common electrode C via a filament transformer FT, and consequently, a filament current If flows. The number of filaments provided in the X-ray tube 11 is not limited to three but may be one, two, four, or more.

The target T is connected to the anode HV+of the X-ray tube 11 and receives the electrons emitted by the filament F of the cathode HV-. The electrons collide with the target T at high speed to generate X-rays. This electron-flow Op corresponds to the current Ip shown in FIG. 4. The grid G has an electric potential for adjusting the electric potential gradient around the filament F. The grid G may be connected to the focusing cup of the filament F, for example. The grid power supply 513 applies a positive voltage between an extraction electrode of the grid G and the common electrode C of the filament F, which generates an electron-flow θ g between the grid G and the filament F and causes an electric current Ig to flow. Hereinafter, the electric current flowing between the electrode of the grid G and the common electrode C of the filaments L, M, S is referred to as the grid current Ig.

Although the filament current If does not change, the grid current Ig increases over time. This is because the number of the thermal electrons in the filament increases due to deterioration over time despite the unchanging filament current If. In detail, as the filament becomes thinner over time, the resistance of the filament increases. Since the electric current I is controlled so as to be constant when $W=I^2R$, the electric power W increases as the resistance R increases. As a result, the number of the thermal electrons increases.

This suggests that the degree of deterioration of filaments over time can be presumed by measuring the grid current Ig. For this reason, in the X-ray diagnostic apparatus 1 according to the embodiment, the grid current measurement circuit 514 (FIG. 3) is provided to measure the grid current Ig corresponding to the filament current If.

Figure 5:
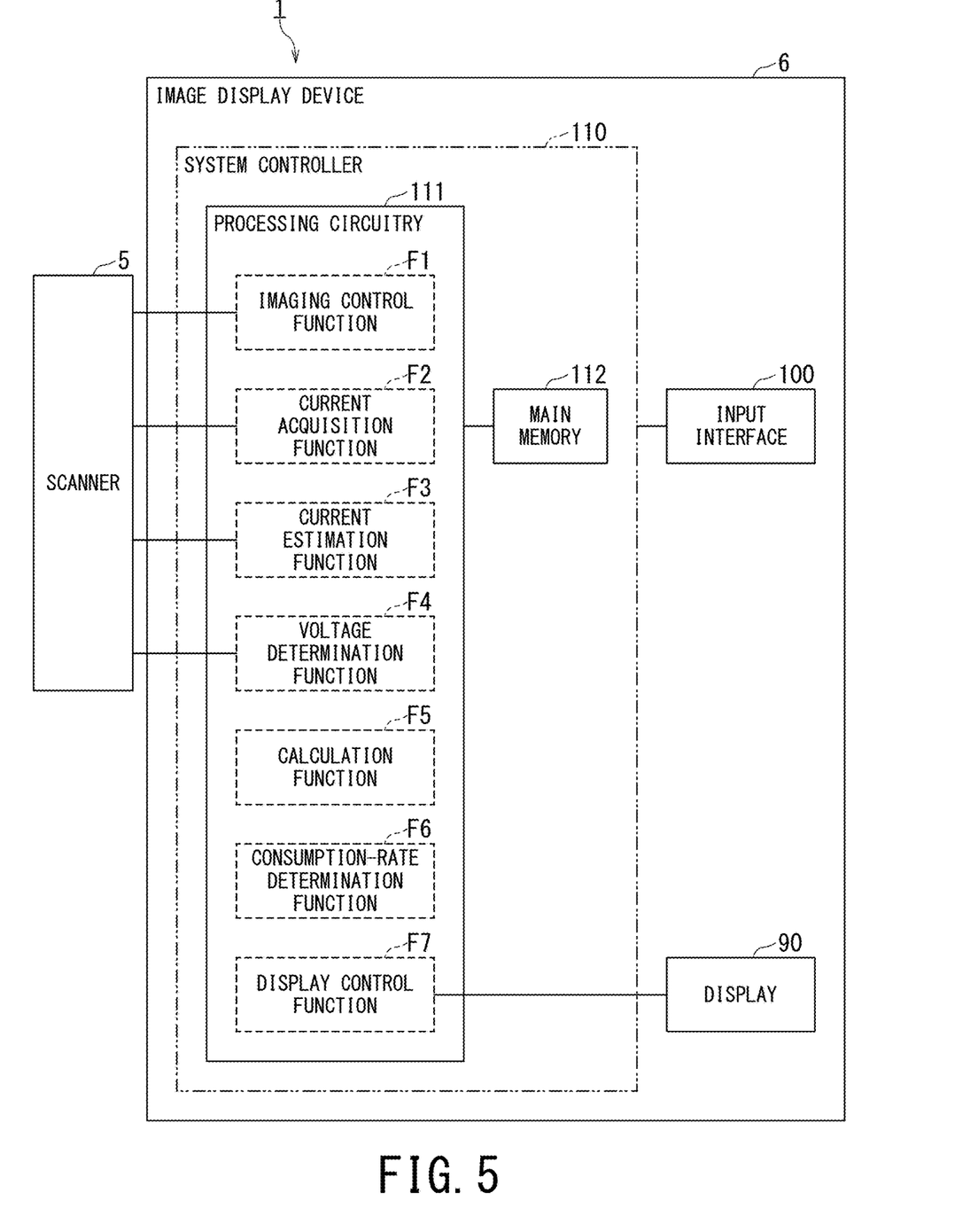
FIG. 5 is a block diagram illustrating a configuration and functions of the X-ray diagnostic apparatus according to the embodiment.

Next, the configuration and functions of the X-ray diagnostic apparatus 1 will be described by using FIG. 5. FIG. 5 is a block diagram illustrating a configuration and functions of the X-ray diagnostic apparatus 1.

The X-ray diagnostic apparatus 1 causes the processing circuitry 111 to execute the computer programs stored in the main memory 112 or directly incorporated into the processing circuitry 111 so as to implement an imaging control function F1, a current acquisition function F2, a current estimation function F3, a voltage determination function F4, a calculation function F5, a consumption rate determination function F6, and a display control function F7. Note that the functions F1 to F7 are not limited to the case where the functions F1 to F7 are achieved by executing the computer programs. All or some of the functions F1 to F7 may be achieved by a circuit such as an ASIC, an FPGA, and a CPLD provided in the X-ray diagnostic apparatus 1. For example, the functions F1 to F7 may be provided as circuits in the control circuit 52 of the high-voltage generation circuit 50 (FIG. 3).

The imaging control function F1 includes a function of performing imaging such as the X-ray radiographic imaging and the X-ray fluoroscopic imaging by controlling the operation of the entirety of the scanner 5, and generating X-ray radiographic images or X-ray fluoroscopic images as X-ray images.

The current acquisition function F2 includes a function of using the grid current measurement circuit 514 to measure the grid current Ig flowing between the electrode of the grid G and the common electrode C of the filament F, and obtaining the measured value of the grid current Ig.

The current estimation function F3 includes a function of estimating the grid current Ig at the end of the lifetime.

The voltage determination function F4 includes a function of determining whether or not a positive voltage can be applied between the electrode of the grid G and the common electrode C of the filament F by the grid power supply 513 when a high voltage is not applied between the anode and the cathode of the X-ray tube 11.

The calculation function F5 includes a function of calculating the lifetime and the consumption rate (i.e., wear degree) of the filament F and an index (i.e., indicator) related to replacement time of the X-ray tube 11 based on the measured value of the grid current Ig flowing between the electrode of the grid G and the common electrode C of the filament F. The calculation function F5 may accurately calculate the value of the index or may estimate a range in which margins are added to the value of the index.

The consumption rate determination function F6 includes a function of comparing the consumption rate of the filament F calculated by the calculation function F5 with a predetermined threshold, and determining whether the X-ray tube 11 should be replaced or not.

The display control function F7 includes a function of causing the display 90 to display X-ray radiographic images or X-ray fluoroscopic images generated by the imaging control function F1 as X-ray images. In addition, the display control function F7 also includes a function of causing the display 90 to display the determination result of the voltage determination function F4, the calculation result (i.e., above-described index) of the calculation function F5, and the determination result of the consumption rate determination function F6. Under the control of the display control function F7, the display 90 displays the determination result of the voltage determination function F4, the calculation result (i.e., above-described index) of the calculation function F5, and the determination result of the consumption rate determination function F6.

Figure 6:
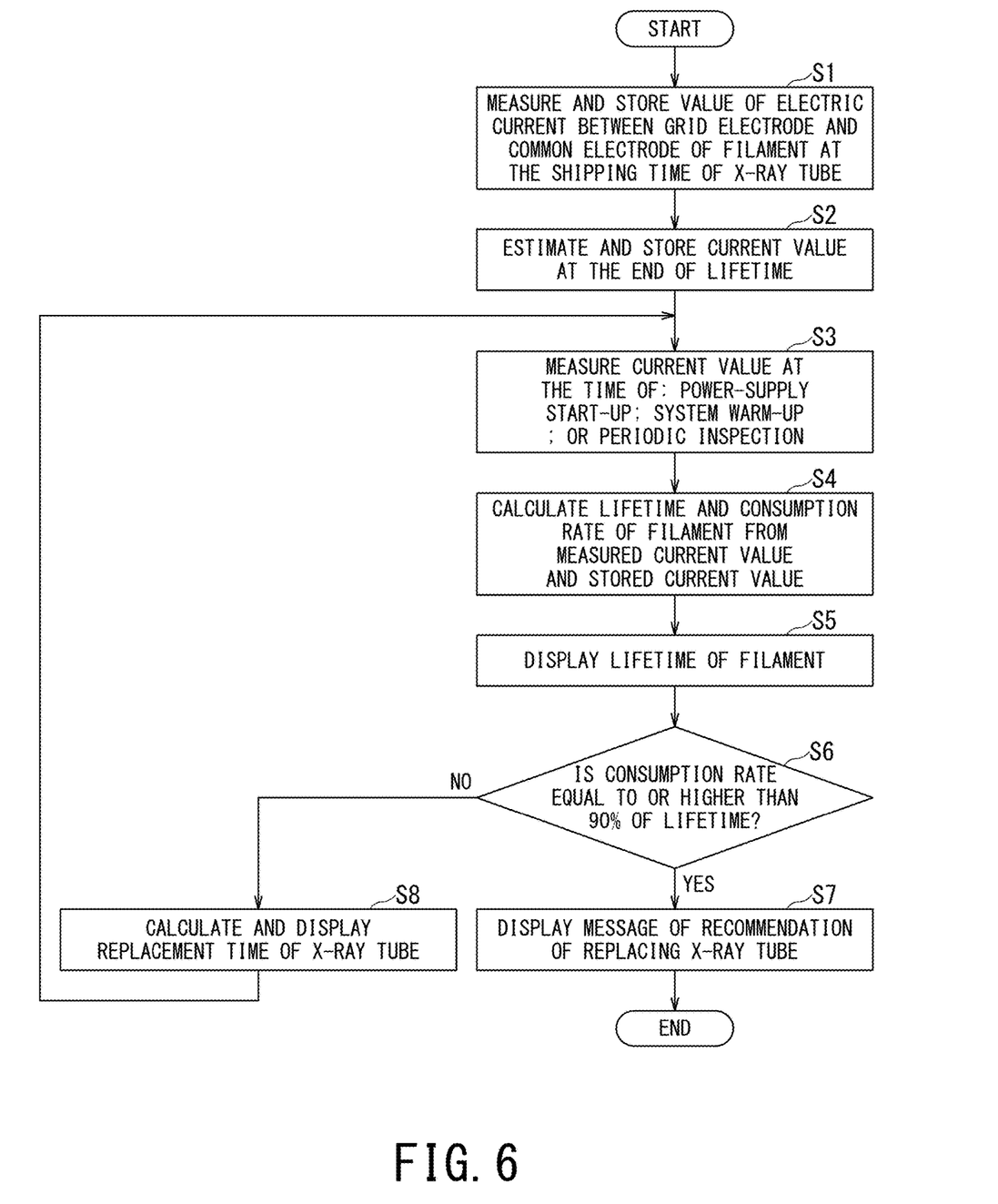
FIG. 6 is a flowchart illustrating operation to be executed by the X-ray diagnostic apparatus according to the embodiment.

FIG. 6 is a flowchart illustrating operation executed by the X-ray diagnostic apparatus 1 according to the embodiment.

In the first step S1, at the factory shipping time of the X-ray tube 11, the current acquisition function F2 causes the grid current measurement circuit 514 to measure the grid current Ig, thereby acquires the measured value, and stores the measured value in the main memory 112 as the grid current Ig at the factory shipping time. Additionally or alternatively, the current acquisition function F2 may acquire the grid current Ig and store it in the main memory 112 at the installation time of the X-ray tube 11.

In the next step S2, the current estimation function F3 estimates the grid current Ig at the end of the lifetime of the X-ray tube 11, and stores the estimated value as the grid current Ig at the end of the lifetime in the main memory 112. For example, the actual value of the grid current Ig when the X-ray tube 11 actually reached its lifetime may be used as the estimated value of the grid current Ig.

In the next step S3, the current acquisition function F2 causes the grid current measurement circuit 514 to measure the grid current Ig at the time of power-supply start-up, warm-up, or periodic inspection of the X-ray generator 10, and then acquires the measured value.

In the next step S4, the calculation function F5 calculates the lifetime of the filament F and the consumption rate of the filament F based on the grid current Ig measured in the step S3 and the grid current Ig at the end of the lifetime stored in the steps S1 and S2. The details will be described below.

In the next step S5, the display control function F7 causes the display 90 to display the lifetime of the filament F calculated in the step S4.

In the next step S6, the consumption rate determination function F6 determines whether the consumption rate of the filament F calculated in the step S4 is equal to or higher than a predetermined threshold. The predetermined threshold is, for example, 90%. If the consumption rate of the filament F is equal to or higher than 90% (YES in the step S6), the processing circuitry 111 advances the processing to the step S7. If the consumption rate of the filament F is not equal to or higher than 90%, i.e., is lower than 90% (NO in the step S6), the processing circuitry 111 advances the processing to the step S8. Noted that the threshold for the consumption rate is not limited to 90% and may be another value.

In the step S7, the display control function F7 causes the display 90 to display a message indicating that the X-ray tube 11 should be replaced, and then the processing circuitry 111 terminates the series of processing.

In the step S8, the calculation function F5 calculates the replacement time of the X-ray tube 11 based on the lifetime of the filament F. The details of the replacement time will be described below. Further, the display control function F7 causes the display 90 to display the calculated replacement time of the X-ray tube 11. The display 90 displays the replacement time indicating when the X-ray tube 11 should be replaced. Afterward, the processing circuitry 111 executes the processing of the step S3 again.

Figure 7:
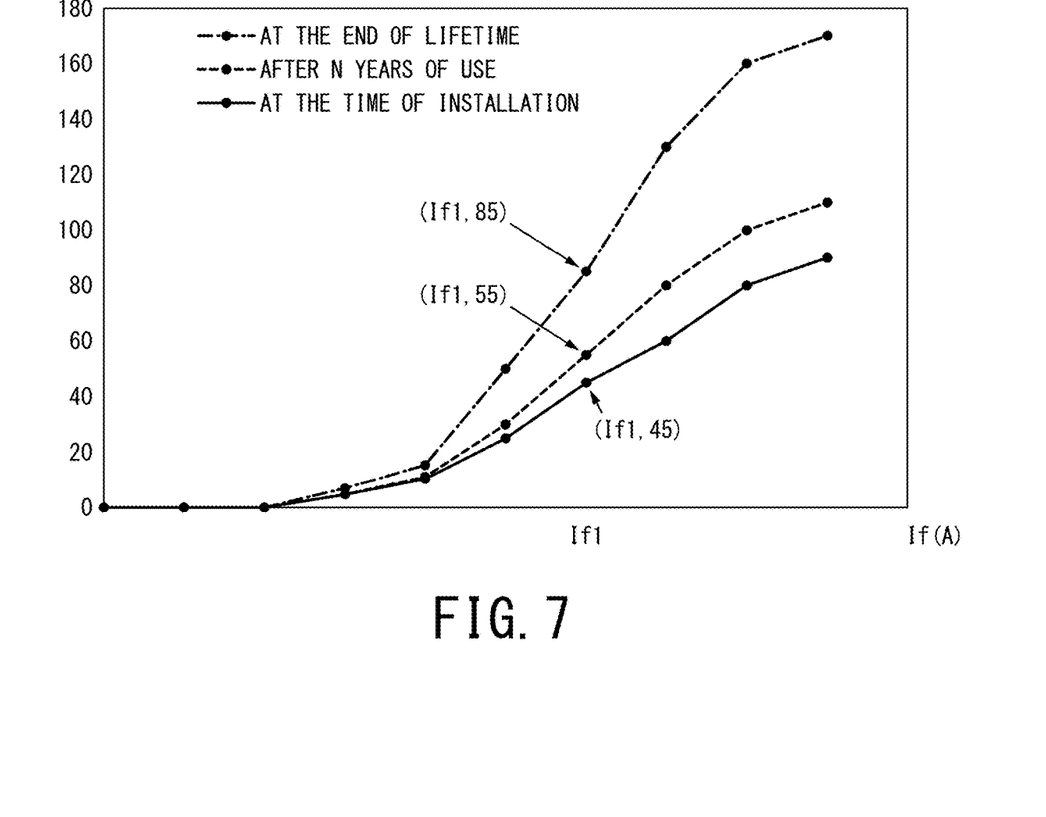
FIG. 7 is a graph illustrating relationship between a filament current and a grid current for each measurement time according to the embodiment.

FIG. 7 is a graph illustrating relationship between the filament current If and the grid current Ig for each measurement time. As shown in FIG. 7, the grid current Ig increases as the filament current If increases. When the filament F deteriorates over time, the grid current Ig keeps increasing even if the filament current If remains the same.

For example, when the current value If is If1 ampere, the measured value of the grid current Ig is 45 milliamperes at the installation time of the X-ray diagnostic apparatus 1, and rises to 55 milliamperes after N years of use. The grid current Ig at the end of the lifetime is estimated to be 85 milliamperes based on the actual values.

Figure 8:
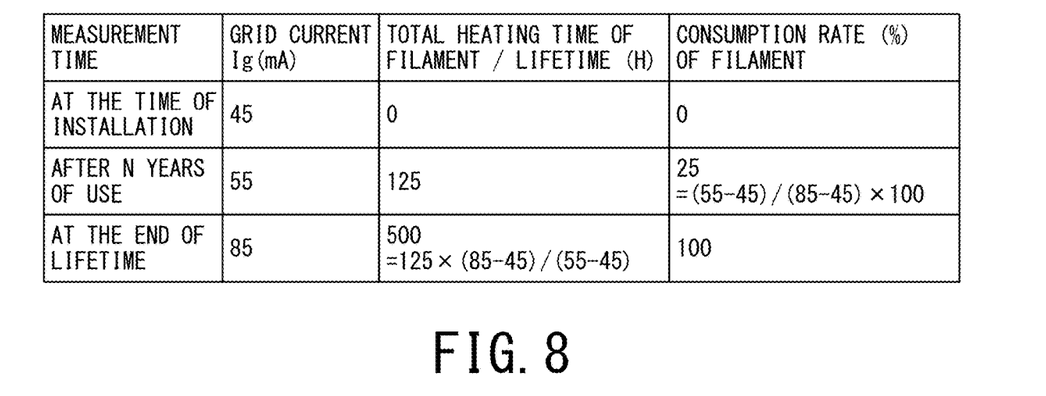
FIG. 8 is a schematic table illustrating a method for calculating a consumption rate and a lifetime of the filament according to the embodiment.

FIG. 8 is a schematic table illustrating a method for calculating the lifetime and the consumption rate of the filament F according to the embodiment. It is assumed that the total filament heating time reaches 125 hours after using the X-ray tube 11 for N years. It is also assumed that the grid current Ig at each measurement time is specified as shown in FIG. 7. The lifetime of the filament F is calculated by Expression 1 below.

Lifetime of filament $F$=(total filament heating time)×(increase in grid current Ig until end of lifetime)/(increase in grid current Ig after $N$ years of use)  Expression 1

For example, assuming that the total filament heating time after N years of use is 125 hours, the lifetime of the filament F is calculated as 125×(85−45)/(55−45)=500 hours. Alternatively, a range where margins are added to the calculated value, for example, 480-520 hours, may be estimated as the lifetime of the filament F.

In addition, under the assumption that the consumption rate of the filament F at the end of the lifetime is 100%, the consumption rate of the filament F after N years of use is calculated by Expression 2 below.

Exhaustion rate of filament $F$ =(increase in grid current Ig after $N$ years of use)/(increase in grid current Ig until end of lifetime)×100%  Expression 2

For example, the consumption rate of the filament F after N years of use is calculated as (55-45)/(85-45)=25%.

Further, assuming that the replacement time of the X-ray tube 11 is the time when the consumption rate of filament F reaches 90%, the replacement time of the X-ray tube 11 is calculated by Expression 3 below.

Replacement time of X-ray tube=(lifetime of filament $F$)×90/100  Expression 3

For example, the replacement time of the X-ray tube 11 is calculated as 500×90/100=450 hours.

The above-described calculation method is only one example under the assumption that the lifetime and the consumption rate of the filament F are proportional to the increase in the grid current Ig, and other calculation methods may be used instead. In addition, the replacement time of the X-ray tube is not limited to the timing when the consumption rate of the filament F reaches 90% and may be the timing when the consumption rate of the filament F reaches any other value.

According to the above-described embodiment, the lifetime and the consumption rate of the filament F are calculated by measuring the grid current Ig flowing between the electrode of the grid G and the common electrode C of the filament F, and thus, the lifetime and the consumption rate can be calculated with high accuracy. Based on the accurately estimated lifetime of the filament F, an appropriate replacement time of the X-ray tube 11 can be obtained. Since it is not necessary to apply a high voltage to the X-ray tube 11 at the time of measuring the grid current Ig, no X-rays are emitted at that measuring time, and it is safe even during the measurement.

First Modification

The voltage determination function F4 may determine whether any voltage (including a positive voltage) can be applied between the electrode of the grid G and the common electrode C of the filament F by the grid power supply 513. When the any voltage can be applied, the current acquisition function F2 may measure the grid current Ig at the time of application of the any voltage.

The timing for determining whether the any voltage can be applied and measuring the grid current Ig may be the timing of start-up of the power supply of the X-ray diagnostic apparatus 1. As an example of the voltage determination function F4, presence/absence of malfunction of the grid-voltage control circuit 523 may be checked by automatic determination. Further, the voltage determination function F4 may determine whether the voltage can be applied at the time of warm-up of the X-ray diagnostic apparatus 1 or at the time of periodic inspection of the X-ray diagnostic apparatus 1.

As to the timing at which the display control function F7 causes the display 90 to display the lifetime of the filament F, a message indicating recommendation of replacement of the X-ray tube 11, or the replacement time of the X-ray tube 11, it is preferably to be the time when the X-ray tube 11 can be replaced, for example, between surgeries using the X-ray diagnostic apparatus 1.

Second Modification

The grid current measurement circuit 514 may be built into the X-ray diagnostic apparatus 1 or may be provided outside the X-ray diagnostic apparatus 1.

Figure 9:
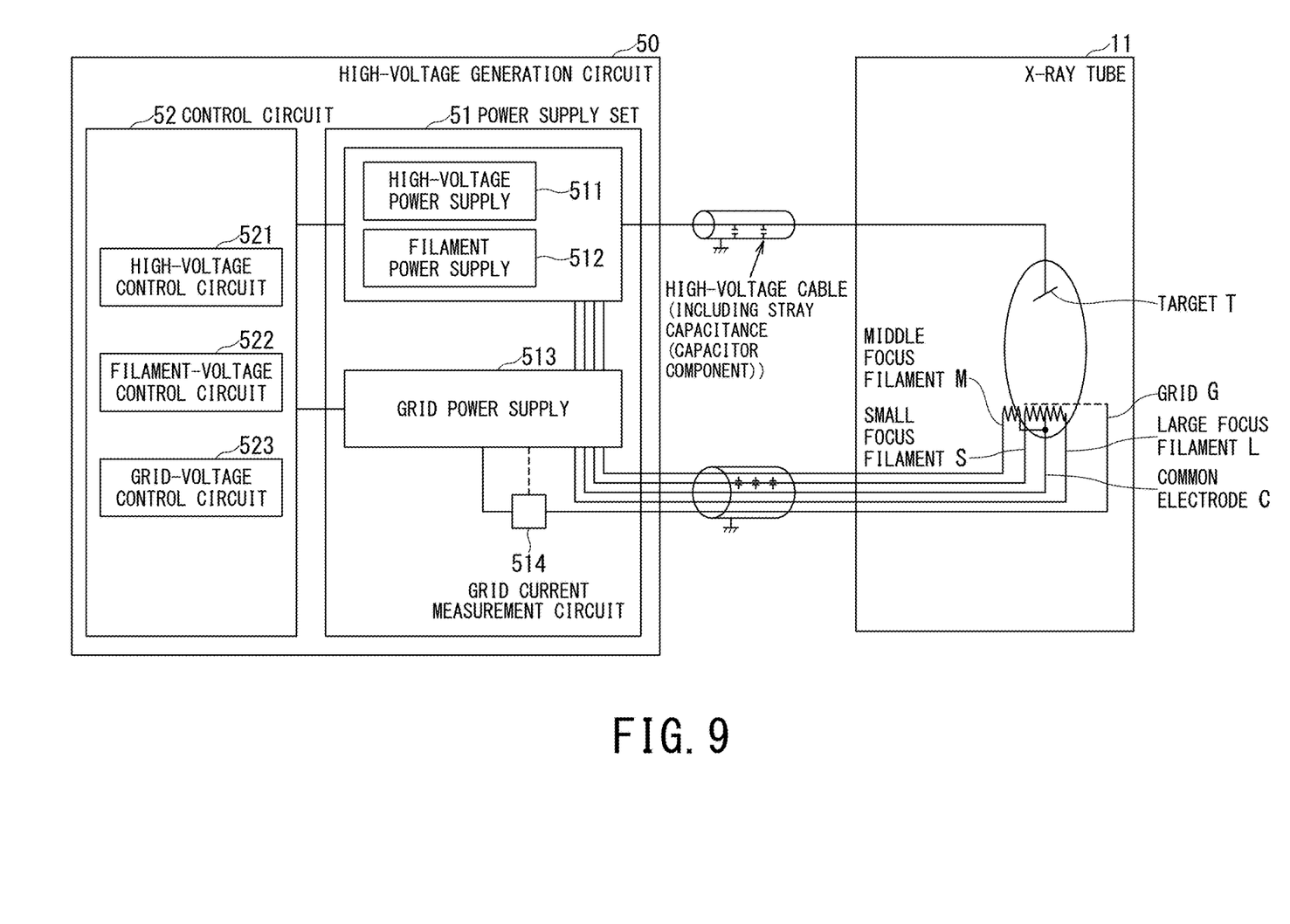
FIG. 9 is a block diagram illustrating a configuration of the X-ray tube and the high voltage generator.

FIG. 9 is a block diagram illustrating the configuration of the X-ray tube 11 and the high voltage generation circuit 50 according to the embodiment. As shown in FIG. 9, the high-voltage generation circuit 50 may be provided with the grid current measurement circuit 514 as an internal circuit. The grid current measurement circuit 514 measures the grid current Ig flowing between the electrode of the grid G on the secondary side and the common electrode C of the filament F by using a measurement means such as a shunt resistor (i.e., current detection resistor) or an HCT (Hall-effect Current Transformer), and transmits the measured current value as a signal to the primary side by using, for example, a photocoupler. In the case of using the HCT, the current value may be transmitted directly to the primary side without electric insulation using a photocoupler.

Additionally or alternatively, an external measurement instrument may be used to directly measure the grid current Ig. For example, it is conceivable to apply a method of measuring the electric current flowing in the grid G of the high voltage cable by using the HCT.

According to at least one embodiment described above, the lifetime of the filament of the X-ray tube can be estimated.

While certain embodiments have been described, these embodiments have been presented by way of example only, and are not intended to limit the scope of the invention. Indeed, the novel methods and systems described herein may be embodied in a variety of other forms; furthermore, various omissions, substitutions and changes in the form of the methods and systems described herein may be made without departing from the spirit of the invention. The accompanying claims and their equivalents are intended to cover such forms or modifications as would fall within the scope and spirit of the inventions.

What is claimed is:

1. An X-ray diagnostic apparatus comprising:
an X-ray generator that includes a filament connected to a cathode of an X-ray tube and configured to emit electrons, a target connected to an anode of the X-ray tube and configured to generate X-rays by receiving the electrons, and a grid configured to adjust an electric potential gradient around the filament;
a current measurement circuit configured to measure a grid current flowing between an electrode of the grid and a common electrode of the filament;
a display; and
processing circuitry configured to
calculate an index related to a lifetime of the filament based on a measurement value of the grid current, and
cause the display to display the index.

2. The X-ray diagnostic apparatus according to claim 1, further comprising a power supply configured to apply a positive voltage between the electrode of the grid and the common electrode of the filament.

3. The X-ray diagnostic apparatus according to claim 2, wherein the processing circuitry is configured to determine whether the positive voltage can be applied by the power supply when a high voltage is not applied between the anode and the cathode of the X-ray tube.

4. The X-ray diagnostic apparatus according to claim 3, wherein the processing circuitry is configured to determine whether the positive voltage can be applied by the power supply at a time of power-supply start-up, warm-up, or periodic inspection of the X-ray diagnostic apparatus.

5. The X-ray diagnostic apparatus according to claim 2, wherein the current measurement circuit is built into the X-ray diagnostic apparatus or is provided outside the X-ray diagnostic apparatus.

6. The X-ray diagnostic apparatus according to claim 2, wherein the processing circuitry is configured to:
calculate replacement time of the X-ray tube based on the lifetime of the filament; and
cause the display to display the replacement time.

7. The X-ray diagnostic apparatus according to claim 1, wherein the current measurement circuit is built into the X-ray diagnostic apparatus or is provided outside the X-ray diagnostic apparatus.

8. The X-ray diagnostic apparatus according to claim 1, wherein the processing circuitry is configured to:
calculate replacement time of the X-ray tube based on the lifetime of the filament; and
cause the display to display the replacement time.

* * * * *